United States Patent [19]

Shioda

[11] Patent Number: 4,937,578

[45] Date of Patent: Jun. 26, 1990

[54] D/A CONVERTER FOR DIGITAL SIGNALS REPRESENTED BY A 2'S COMPLEMENT

[75] Inventor: Fumio Shioda, Tokyo, Japan

[73] Assignee: NEC Corporation, Tokyo, Japan

[21] Appl. No.: 322,940

[22] Filed: Mar. 14, 1989

[30] Foreign Application Priority Data

Mar. 15, 1988 [JP] Japan .................................. 63-59389

[51] Int. Cl.⁵ .............................................. H03M 1/80
[52] U.S. Cl. ...................................... 341/150; 341/127
[58] Field of Search .......................... 341/127, 150, 153

[56] References Cited

U.S. PATENT DOCUMENTS

| | | | |
|---|---|---|---|
| 4,763,108 | 8/1988 | Kobayashi | 341/150 |
| 4,799,042 | 1/1989 | Confalonieri et al. | 341/150 |
| 4,843,393 | 6/1989 | Kuraishi | 341/150 |

Primary Examiner—William M. Shoop, Jr.
Assistant Examiner—Marc S. Hoff
Attorney, Agent, or Firm—Foley & Lardner, Schwartz, Jeffery, Schwaab, Mack, Blumenthal & Evans

[57] ABSTRACT

A digital-to-analog (D/A) converter for converting a n-bit digital 2's complement signal to an analog signal. The D/A converter consists of a controller, a capacitor array, and a switch array. The controller operates to convert a 2's complement digital input signal into a 1's complement digital signal. The capacitor array consists of $(n-1)$ capacitors each being connected at one electrode to a common output terminal. The switch array consists of $(n-1)$ switches each connected individually to the remaining electrodes of the $(n-1)$ capacitors. The switch array applies either one of a first or a second reference voltage to the $(n-1)$ capacitors in response a second controller signal. An additional capacitor and switch are connected to the capacitor and switch arrays which serve to convert a digital signal from 2's complement to 1's complement. The additional switch, unlike the other switches, feeds either the first or second reference voltage to the additional capacitor in response to the first controller signal, or it feeds the first reference voltage in response to the third controller signal.

10 Claims, 7 Drawing Sheets

FIG. 2b
PRIOR ART
CLK="0", D5="0"

FIG. 2d
PRIOR ART
CLK="0", D5="1"

FIG. 2a
PRIOR ART
CLK="1", D5="0"

FIG. 2c
PRIOR ART
CLK="1", D5="1"

FIG. 3
PRIOR ART

| MSB DIGITAL DATA | | | | | | ANALOG OUTPUT LEVEL | CLK = 1 | | | | | | CLK = 0 | | | | | |
|---|---|---|---|---|---|---|---|---|---|---|---|---|---|---|---|---|---|---|
| D5 | D4 | D3 | D2 | D1 | D0 | | SG | S4 | S3 | S2 | S1 | S0 | SG | S4 | S3 | S2 | S1 | S0 |
| 0 | 1 | 1 | 1 | 1 | 1 | 62 | 1 | 0 | 0 | 0 | 0 | 0 | 0 | 1 | 1 | 1 | 1 | 1 |
| 0 | 1 | 1 | 1 | 1 | 0 | 61 | 1 | 0 | 0 | 0 | 0 | 0 | 0 | 1 | 1 | 1 | 1 | 0 |
| 0 | 1 | 1 | 1 | 0 | 1 | 60 | 1 | 0 | 0 | 0 | 0 | 0 | 0 | 1 | 1 | 1 | 0 | 1 |
| 0 | | | | | | | | | | | | | | | | | | |
| 0 | | | | | | | | | | | | | | | | | | |
| 0 | 0 | 0 | 0 | 1 | 0 | 33 | 1 | 0 | 0 | 0 | 0 | 0 | 0 | 0 | 0 | 0 | 1 | 0 |
| 0 | 0 | 0 | 0 | 0 | 1 | 32 | 1 | 0 | 0 | 0 | 0 | 0 | 0 | 0 | 0 | 0 | 0 | 1 |
| 0 | 0 | 0 | 0 | 0 | 0 | 31 | 1 | 0 | 0 | 0 | 0 | 0 | 0 | 0 | 0 | 0 | 0 | 0 |
| 1 | 0 | 0 | 0 | 0 | 0 | 31 | 1 | 0 | 0 | 0 | 0 | 0 | 0 | 0 | 0 | 0 | 0 | 0 |
| 1 | 0 | 0 | 0 | 0 | 1 | 30 | 1 | 0 | 0 | 0 | 0 | 1 | 0 | 0 | 0 | 0 | 0 | 0 |
| 1 | 0 | 0 | 0 | 1 | 0 | 29 | 1 | 0 | 0 | 0 | 1 | 0 | 0 | 0 | 0 | 0 | 0 | 0 |
| | | | | | | | | | | | | | | | | | | |
| 1 | 1 | 1 | 1 | 0 | 1 | 2 | 1 | 1 | 1 | 1 | 0 | 1 | 0 | 0 | 0 | 0 | 0 | 0 |
| 1 | 1 | 1 | 1 | 1 | 0 | 1 | 1 | 1 | 1 | 1 | 1 | 0 | 0 | 0 | 0 | 0 | 0 | 0 |
| 1 | 1 | 1 | 1 | 1 | 1 | 0 | 1 | 1 | 1 | 1 | 1 | 1 | 0 | 0 | 0 | 0 | 0 | 0 |

| MSB | | | | | | ANALOG | CLK = 1 | | | | | | | CLK = 0 | | | | | | |
|---|---|---|---|---|---|---|---|---|---|---|---|---|---|---|---|---|---|---|---|---|
| D5 | D4 | D3 | D2 | D1 | D0 | OUTPUT LEVEL | SG | S4 | S3 | S2 | S1 | S0 | SA | SG | S4 | S3 | S2 | S1 | S0 | SA |
| 0 | 1 | 1 | 1 | 1 | 1 | 63 | 1 | 0 | 0 | 0 | 0 | 0 | 0 | 0 | 1 | 1 | 1 | 1 | 1 | 0 |
| 0 | 1 | 1 | 1 | 1 | 0 | 62 | 1 | 0 | 0 | 0 | 0 | 0 | 0 | 0 | 1 | 1 | 1 | 1 | 0 | 0 |
| 0 | 1 | 1 | 1 | 0 | 1 | 61 | 1 | 0 | 0 | 0 | 0 | 0 | 0 | 0 | 1 | 1 | 1 | 0 | 1 | 0 |
| 0 | | | | | | | | | | | | | | | | | | | | |
| 0 | | | | | | | | | | | | | | | | | | | | |
| 0 | 0 | 0 | 0 | 1 | 0 | 34 | 1 | 0 | 0 | 0 | 0 | 0 | 0 | 0 | 0 | 0 | 0 | 1 | 0 | 0 |
| 0 | 0 | 0 | 0 | 0 | 1 | 33 | 1 | 0 | 0 | 0 | 0 | 0 | 0 | 0 | 0 | 0 | 0 | 0 | 1 | 0 |
| 0 | 0 | 0 | 0 | 0 | 0 | 32 | 1 | 0 | 0 | 0 | 0 | 0 | 0 | 0 | 0 | 0 | 0 | 0 | 0 | 0 |
| 1 | 1 | 1 | 1 | 1 | 1 | 31 | 1 | 0 | 0 | 0 | 0 | 0 | 1 | 0 | 0 | 0 | 0 | 0 | 0 | 0 |
| 1 | 1 | 1 | 1 | 1 | 1 | 30 | 1 | 0 | 0 | 0 | 0 | 1 | 1 | 0 | 0 | 0 | 0 | 0 | 0 | 0 |
| 1 | 1 | 1 | 1 | 0 | 1 | 29 | 1 | 0 | 0 | 0 | 1 | 0 | 1 | 0 | 0 | 0 | 0 | 0 | 0 | 0 |
| | | | | | | | | | | | | | | | | | | | | |
| 1 | 0 | 0 | 0 | 1 | 0 | 2 | 1 | 1 | 1 | 1 | 0 | 1 | 1 | 0 | 0 | 0 | 0 | 0 | 0 | 0 |
| 1 | 0 | 0 | 0 | 0 | 1 | 1 | 1 | 1 | 1 | 1 | 1 | 0 | 1 | 0 | 0 | 0 | 0 | 0 | 0 | 0 |
| 1 | 0 | 0 | 0 | 0 | 0 | 0 | 1 | 1 | 1 | 1 | 1 | 1 | 1 | 0 | 0 | 0 | 0 | 0 | 0 | 0 |

D/A CONVERTER FOR DIGITAL SIGNALS REPRESENTED BY A 2'S COMPLEMENT

BACKGROUND OF THE INVENTION

The present invention relates to a digital-to-analog (D/A) converter and, more particularly, to a charge redistribution type D/A converter using a capacitor array.

A D/A converter of the type described may be implemented by an array of capacitors each being weighted by a 2's power, as is well known in the art. This kind of D/A converter has customarily been designed on the assumption that the input digital signal is represented by a sign-magnitude which belongs to a family of binary representations. Another binary representation is a two's complement representation which is customarily used for arithmetic operations. Heretofore, a digital signal represented by a 2's complement has been converted into an analog signal after changing the 2's complement representation to the sign-magnitude representation, resulting in a large-scale and complicated circuit configuration.

SUMMARY OF THE INVENTION

It is therefore an object of the present invention to provide a D/A converter capable of converting a digital signal represented by a 2's complement into an analog signal with simple circuitry added to a prior art D/A converter.

According to one aspect of the present invention, there is provided a digital-to-analog (D/A) converter for converting an n-bit digital signal represented by 2's complement to an analog signal, comprising: a capacitor array comprising (n-1) capacitors each being weighted by a 2's power and commonly connected at one electrode to a common output terminal; a control circuit for producing first, second and third control signals from an operation clock and the digital signal; a switch array comprising (n−1) switches connected one-to-one to the other electrode of said (n−1) capacitors for applying either one of a first and a second reference voltage to the (n−1) capacitors in response to the second control signal; an additional capacitor connected at one electrode to the output terminal; a first switch connected to the other electrode of the additional capacitor for feeding either one of the first and second reference voltages to the additional capacitor in response to the first control signal; and a second switch connected to the output terminal for feeding the first reference voltage in response to the third control signal.

BRIEF DESCRIPTION OF THE DRAWINGS

The above and other objects, features and advantages of the present invention will become more apparent from the following detailed description taken with the accompanying drawings in which:

FIG. 1b is a circuit diagram of a control circuit included in the D/A converter of FIG. 1a;

FIGS. 2a to 2d are schematic diagrams useful for understanding the operation of the D/A converter shown in FIG. 1a;

FIG. 4b is a circuit diagram showing a specific construction of a control circuit which is included in the D/A converter of FIG. 4a;

FIGS. 5a to 5d are schematic diagrams demonstrating the operation of the D/A converter shown in FIG. 4a;

FIG. 7 is a circuit diagram showing an alternative construction of the control circuit included in the D/A converter of FIG. 4a.

DETAILED DESCRIPTION OF PREFERRED EMBODIMENT

To facilitate an understanding of the present invention, a brief reference will be made to a prior art D/A converter shown in FIG. 1a which converts a digital signal which is represented by a sign-magnitude into corresponding analog signal. As shown, a 6-bit digital signal is applied to the D/A converter via an input terminal 7. The first digit D0 and the sixth digit D5 of the digital signal are the LSB (Least Significant Bit) and the MSB (Most Significant Bit), respectively. A control circuit 8 receives the input digital signal from a clock input terminal 6 which carries the operation clock pulse CLK. In response, the control circuit 8 generates control signals S0 to S4 and SG associated respectively with the digits D0 to D5 of the digital signal. A first reference voltage VG and a second reference voltage VR are fed from the outside to a first terminal 2 and a second terminal 3, respectively. A capacitor array 1 is made up of five capacitors which are individually weighted by 2's powers and have one electrode commonly connected to an output terminal 9. A switch array 4 is composed of five switches SW0 to SW4 which are associated with the control signals S0 to S4, respectively. In response to the control signals S0 to S4, the switches SW0 to SW4 selectively connect the other electrodes of their associated capacitors to the first and second terminals 2 and 3. A switch SWG connects the output terminal 9 to the first terminal 2 in response to the control signal SG.

Figure 1A:
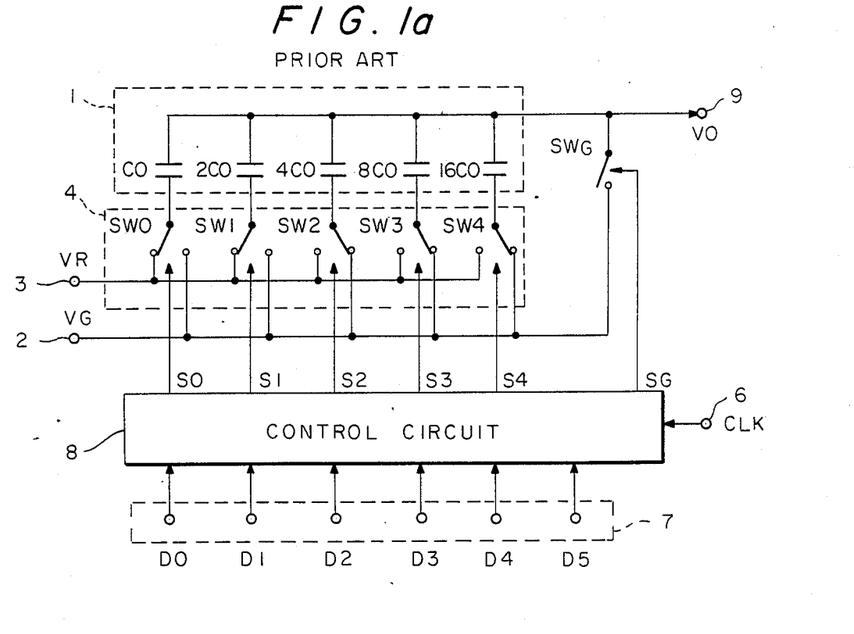
FIG. 1a is a circuit diagram of a prior art charge redistribution type D/A converter.
Figure 1B:
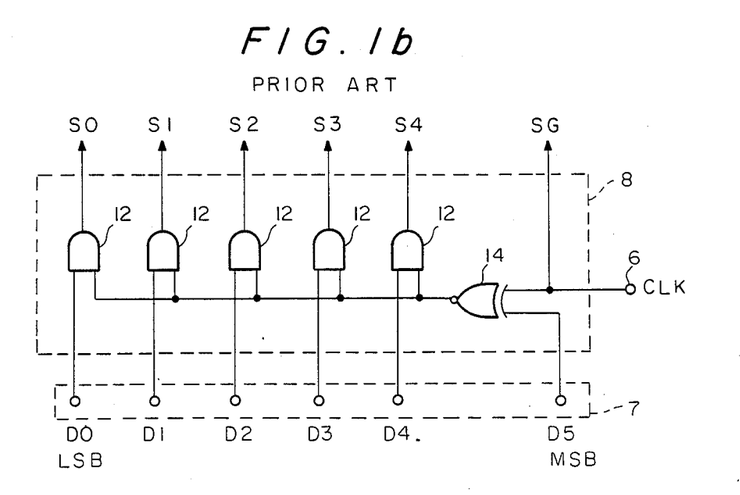
Figure 2A:
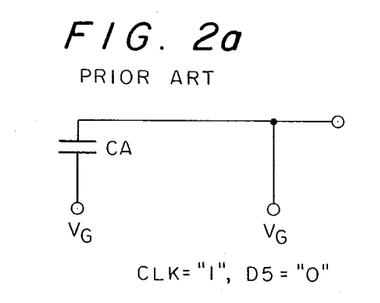
Figure 2B:
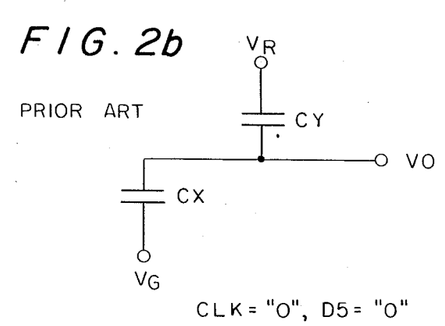
Figure 2C:
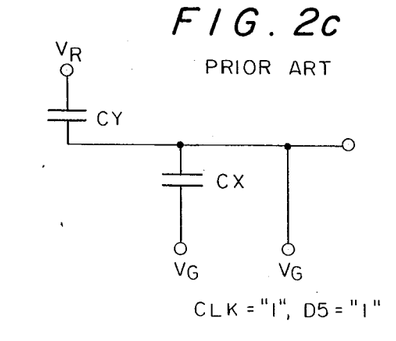
Figure 2D:
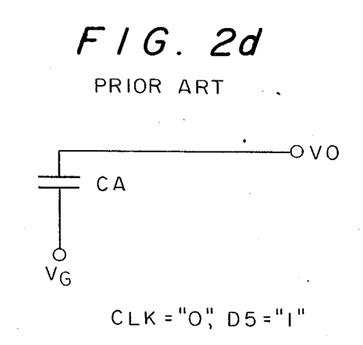

FIG. 1b shows a specific construction of the control circuit 8 built in the D/A converter of FIG. 1a. In the figure, the control circuit 8 is comprised of an Exclusive-NOR (EXNOR) gate 14 which receives the clock pulse CLK via the terminal 6 and the sixth digit D5 or MSB of the input digital signal. The control circuit 8 also comprises five AND gates 12 each receiving an output of the EXNOR gate 14 at one input terminal and respective one of the first to fifth digits D0 to D4 of the input digital signal at the other input terminal. It will be clear from the FIG. 1b configuration that the control circuit 8 delivers the input digits D0 to D4 as control signals S0 to S4 as they are, in any of the following two conditions: when the clock pulse CLK has a high level and the sixth digit D5 of the input digital signal is a (logical) ONE, or when the clock pulse CLK has a low level and the sixth digit D5 is in a (logical) ZERO. As for the control signal SG, the clock pulse CLK is directly fed out. In response to such control signals S0 to S4, the switches SW0 to SW4 of the switch array 4 individually select either one of the first and second reference voltages VG and VR.

The operation of the prior art D/A converter having the above construction will be described with reference to FIGS. 2a to 2d. Assume that the switches SW0 to SW4 select the first and second reference voltages VG and VR when their associated control signals S0 to S4 are in a ZERO and in a ONE, respectively, that the switch SWG closes when the control signal SG is a ONE and opens if it is a ZERO, and that the reference voltage VG is lower than the reference voltage VR. Further, for the illustrative purpose, assume that the total capacitance of the capacitors which constitute the capacitor array 1 is CA when they are all paralleled in connection, that the total capacitance of those capacitors of the capacitor array 1 which are jointly connected to the first terminal 2 via the switches SW0 to SW4 is CX, and that the total capacitance of those capacitors which are jointly connected to the second terminal 3 is CY. The total capacitance CA is of course equal to the sum of CX and CY.

While the sixth digit (MSB) D5 of a positive input digital signal is in a ZERO and the clock pulse CLK is in a ONE (FIG. 2a), all the AND gates 12 of the control circuit 8 shown in FIG. 1b are disabled, resulting in all the control signals S0 to S4 being in a ZERO. Consequently, the switches SW0 to SW4 of the switch array 4 select the first reference voltage VG without exception. At this instant, the switch SWG is closed because the control signal SG is a ONE. As a result, all charge stored in all the capacitors of the capacitor array 1 discharge so that the potential on the analog terminal 9 becomes equal to the first reference voltage VG. On the other hand, as the clock pulse CLK becomes a ZERO (FIG. 2b), the control signal SG turns from a ONE to a ZERO to thereby open the switch SWG and all the AND gates 12 of the control circuit 8 are enabled so that the first to fifth digits D0 to D4 are fed out as control signals S0 to S4. The capacitors (total capacitance of CY) connected to those of the switches SW0 to SW4 which have received the control signals having a ONE level are each charged by the second reference voltage VR, and a potential variation of CY/CA·(VR−VG) occurs on the output terminal 9 as a result of the D/A conversion which is based on the charge conservation principle.

On the other hand, while the sixth digit D5 of a negative digital signal is a ONE and the clock pulse CLK is a ONE (FIG. 2c), the control circuit 8 produces the first to fifth digits D0 to D4 as control signals S0 to S4. In this condition the second reference voltage VR is applied to those capacitors which are associated with the digits that are a ONE, and the first reference voltage VG is applied to the others which are associated with a ZERO. It will be seen that since the switch SWG is closed, the potential appearing on the analog output terminal 9 is identical with the first reference voltage VG. As the clock pulse CLK turns from a ONE to a ZERO (FIG. 2d), the switch SWG is opened and then all the control signals S0 to S4 become a ZERO, resulting in parallel connection of all of the capacitors via a line supplied with the first reference voltage VG. Thus, the charge is redistributed among all the capacitors. On the analog terminal 9, therefore, the potential is lowered by CY/CA·(VR−VG) as a result of the D/A conversion of the negative input digital signal.

Figure 3:
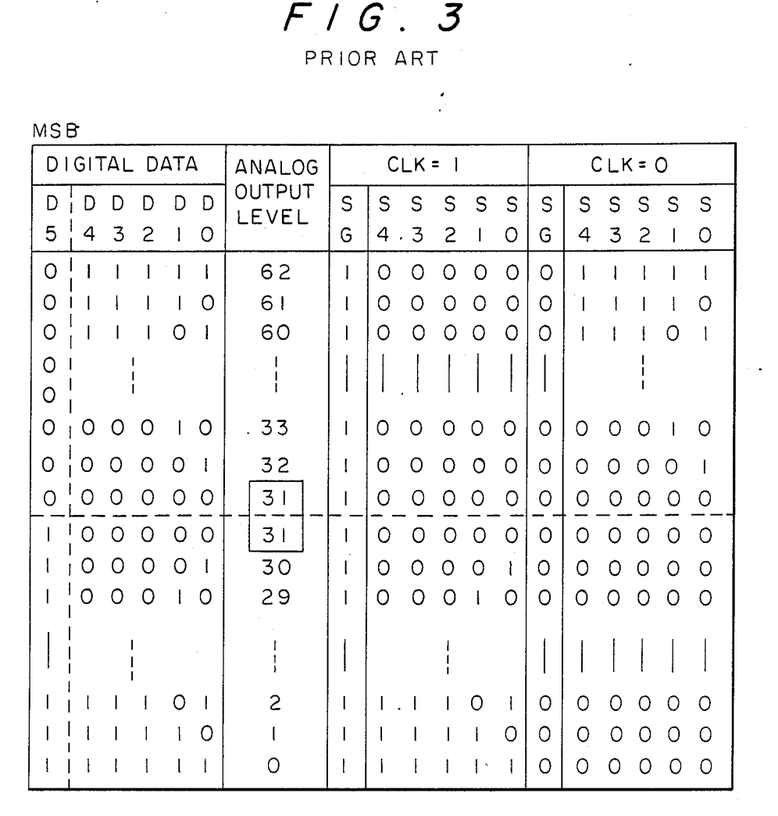
FIG. 3 is a table showing a relationship between an input digital signal, analog output signal level, and control signals particular to the prior art.

FIG. 3 tabulates a relationship between the respective digits of the digital signal and the control signals which holds in the sequence of operations described above. As shown, the D/A converter operates in exactly the same manner with two different digital signals "000000" and "100000", i.e., it converts them into the same analog level. These two different data are representative of the same ZERO in sign-magnitude representation, but they are individually representative of "0" and "−32" in 2's complement representation. Further, since the representation of a negative number differs from the sign-magnitude method to the 2's complement method, the D/A converter shown in FIGS. 1a and 1b cannot be applied to the conversion of a digital signal which is represented by a 2's complement without resorting to correction. For the correction, both "000000" and "100000" have to be treated as zero. Specifically, when "000000" is treated as zero, 1 (one) is subtracted from the least significant bit (LSB) of a digital signal whose sixth digit (MSB) D5 is a ONE. Conversely, when "100000" is treated as zero, 1 is added to the LSB of a digital signal whose sixth digit D5 is a ZERO. However this kind of approach is not practical unless a means for adding or subtracting is provided without increasing the circuit scale. Moreover, a means for adding or subtracting would invite respectively underflow and overflow and therefore need round-off, giving rise to an error problem.

Figure 4A:
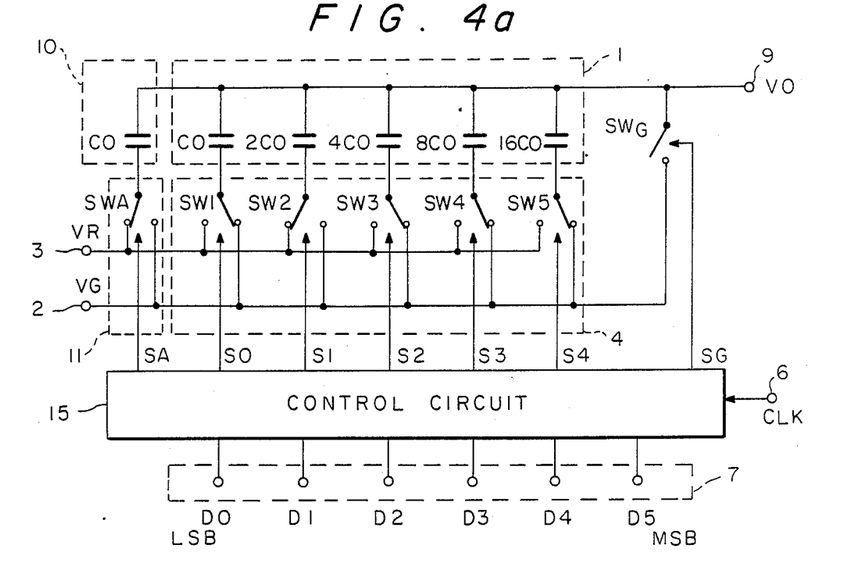
FIG. 4a is a circuit diagram of a D/A converter embodying the present invention.
Figure 4B:
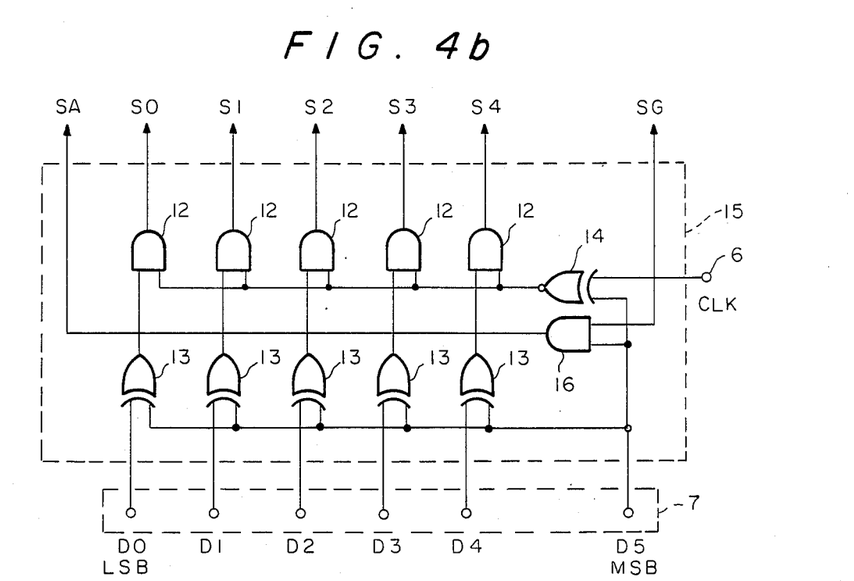

Referring to FIG. 4a, a D/A converter embodying the present invention is shown. In the figure, the same or similar structural elements as those shown in FIGS. 1a and 1b are designated by like reference numerals. In the illustrative embodiment, a capacitor 10 having a unit capacitance C0, a switch SWA associated with the capacitor 10, and means for generating a control signal SA are added to the prior art D/A converter. This is successful in eliminating the above-stated overflow and underflow with a minimum of increase in the number of parts. In FIG. 4a, a digital signal represented by a 2's complement is fed to a control circuit 15 via an input terminal 7. A specific construction of the control circuit 15 is shown in FIG. 4b. The control circuit 15 of FIG. 4b is identical with the control circuit 8 of FIG. 1b except for Exclusive-OR (EXOR) gates 13 and an AND gate 16. The AND gate 16 produces a control signal SA by an AND operation between the clock pulse CLK and the sixth digit of the input signal (MSB) D5. Individually associated with the digits of the input signal except for the MSB D5, the EXOR gates 13 deliver the digits D0 to D4 and the inverted digits of the digits D0 to D4 when the digit D5 is in a ZERO and in a ONE, respectively. The resulting inverted digits which represent 1's complement of a binary number consisting of the digits D0 to D4, are combined with an output of the AND gate 16 to thereby transform the 2's complement representation into the sign-magnitude representation. This is derived from the fact that negative numbers in 2's complement representation and sign-magnitude representation can be converted into each other by inverting all of the digits except for MSB to inverted digits and adding "1" to the least significant digit of the inverted digits. The AND gates 12 cooperate with the EXNOR gate 14 to deliver the non-inverted or the inverted first to fifth digits D0 to D4 as control signals S0 to S4 when the clock pulse CLK is a ONE or a ZERO, depending upon the value of the sixth digit D5. An additional switch SWA (FIG. 4a), like any of the switches SW1 to SW4 of the switch array 4, selects the second reference voltage VR when a control signal SA is a ONE and selects the first reference voltage VG when it is a ZERO.

The D/A converter shown in FIGS. 4a and 4b operates as will be described with reference to FIGS. 5a to 5d.

Figure 5A:
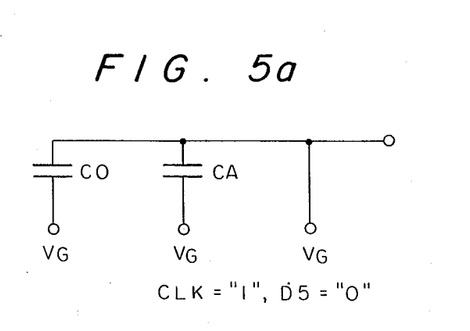

When the clock pulse CLK turns from a ZERO to a ONE while the digital signal is positive, i.e., while the sixth digit D5 is in a ZERO, the output of the EXNOR gate 14 of the control circuit 15 becomes a ZERO. Consequently, the AND gates 12 are all disabled to in turn change all of the control signals S0 to S4 to a ZERO. Since the output of AND gate 16 is also in a ZERO, the control signal SA becomes a ZERO. In this condition, the first reference voltage VG is applied to all of the capacitors of the capacitor array 1 and the additional capacitor 10. At this instant, the control signal SG is a clock pulse itself and therefore becomes a ONE to close the switch SWG. As a result, all the capacitors in the D/A converter discharge the charge stored therein to provide the first reference voltage VG on the output terminal 9 (FIG. 5a).

Figure 5B:
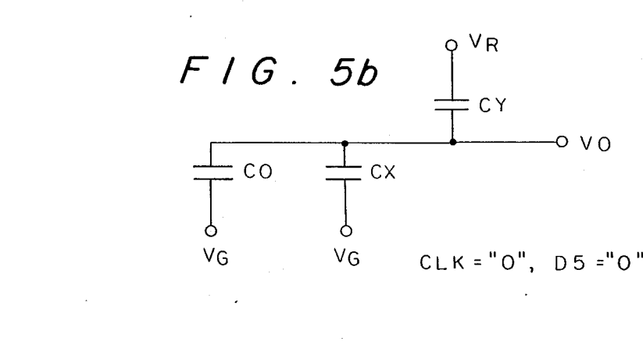

Upon change of the clock pulse CLK to a ZERO, the control signal SG changes to ZERO to open the switch SWG, and the output of the EXNOR gate 14 turns to a ONE to enable the AND gates 12. Then, the AND gates 12 produce the control signals S0 to S4 which are associated respectively with the first to fifth digits D0 to D4 of the digital signal. Since the sixth digit D5 of the digital signal is in a ZERO as stated above, the first to fifth digits D0 to D4 are directly fed out as control signals S0 to S4 without being effected by the EXOR gate 13. In response to the control signals S0 to S4, the switches SW0 to SW4 of the switch array 4 individually select either one of the first and second reference voltages VG or VR and apply it to their associated capacitors. Therefore, a series connection of those of the capacitors of the capacitor array 1 which are associated with the control signals having a ONE level (total capacitance of CY) and those of the capacitors which are associated with the control signal having a ZERO level (CX) are charged by a difference between the second and first reference voltages VR and VG, i.e. (VR−VG). However, the additional capacitor 10 is not charged because the output of the AND gate 16 remains in a ZERO. As a result, the voltage appearing on the output terminal 9 becomes higher than the first reference voltage VG by {CY/(CA+CO)}·(VR−VG) as a result of the D/A conversion (FIG. 5b).

Figure 5C:
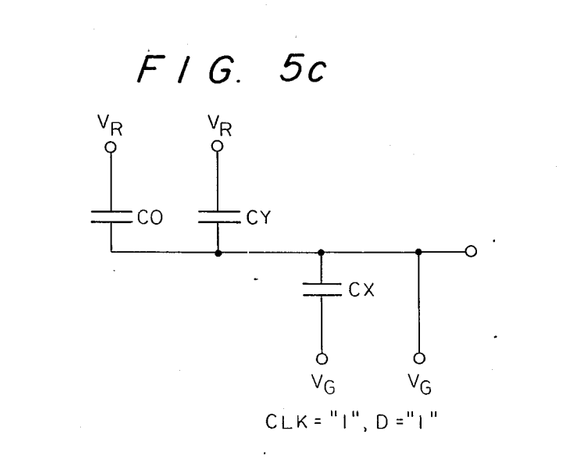

On the other hand, when the clock pulse CLK becomes a ONE while the digital signal is negative, i.e., while the sixth digit D5 is in a ONE, the output of the EXNOR gate 14 also becomes a ONE to enable the AND gates 12. Then, the AND gates 12 produce control signals S0 to S4 which are associated with the digital data. Since the sixth digit D5 is in a ONE, the first to fifth digits D0 to D4 of the digital data are individually inverted by the EXOR gates 13 and then fed out as control signals S0 to S4. This causes the first or the second reference voltage VG or VR to be applied to the capacitors of the capacitor array 1 in associated with the control signals S0 to S4, as has been the case with the positive digital signal. Since the output of the AND gate 16 turns from a ZERO to a ONE, the control signal SA also changes from a ZERO to a ONE resulting in the second reference voltage VR being fed to the additional capacitor 10 via the switch SWA. Consequently, the sum of the total capacitance CY of those capacitors of the capacitor array 1 to which the second reference voltage VR is applied and the capacitance CO of the additional capacitor 10, i.e., (CO+CY) is charged by the difference between the first and second reference voltages, i.e. (VR−VG). Since the clock pulse CLK is in a ONE, the control signal SG is also in a ONE so that the switch SWG is closed to cause the first reference voltage VG to appear on the output terminal 9 (FIG. 5c).

Figure 5D:
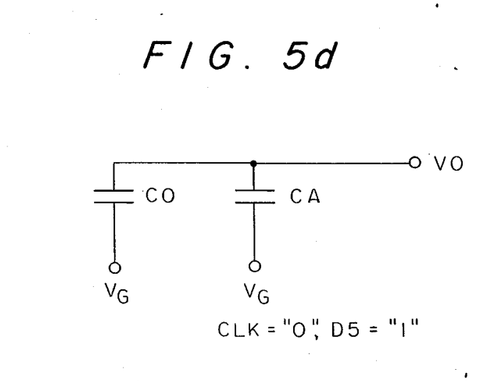

As the clock pulse CLK turns from a ONE to a ZERO, the control signal SG becomes a ONE, causing the switch SWG responsive to the control signal SG to open. Subsequently, the output of the EXNOR gate 14 changes to a ZERO with the result that the AND gates 12 are disabled to turn all of the control signals S0 to S4 to a ZERO. The control signal SA also becomes a ZERO because the output of the AND gate 16 turns from a ONE to a ZERO, whereby the first reference voltage VG is applied to all of the capacitors in the D/A converter via the associated switches SWA and SW0 to SW4. As a result, the voltage on the output terminal 9 is lowered below the first reference voltage VG by (CO+CY)/(CA+CO)·(VR−VG) as a result of the D/A conversion of the input digital signal (FIG. 5d).

As stated above, in the illustrative embodiment, the operation is such that when the input digital signal is negative, "1" is subtracted from the LSB of the input signal, and the capacitance of the additional capacitor 10 is equal to CO, which is the unit capacitance of the capacitor array 1.

Figure 6:
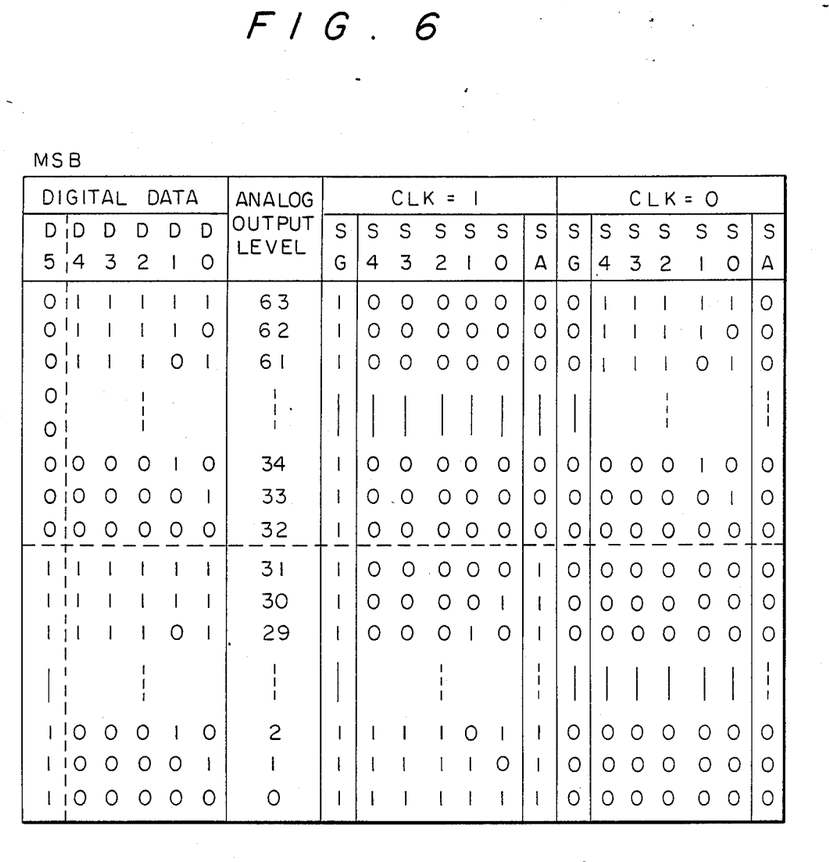
FIG. 6 is a table showing a relationship between an output signal of the control circuit shown in FIG. 4b and an input digital signal.

FIG. 6 tabulates the general relationship between the digits of a digital signal and control signals particular to the D/A converter in accordance with the present invention.

Figure 7:
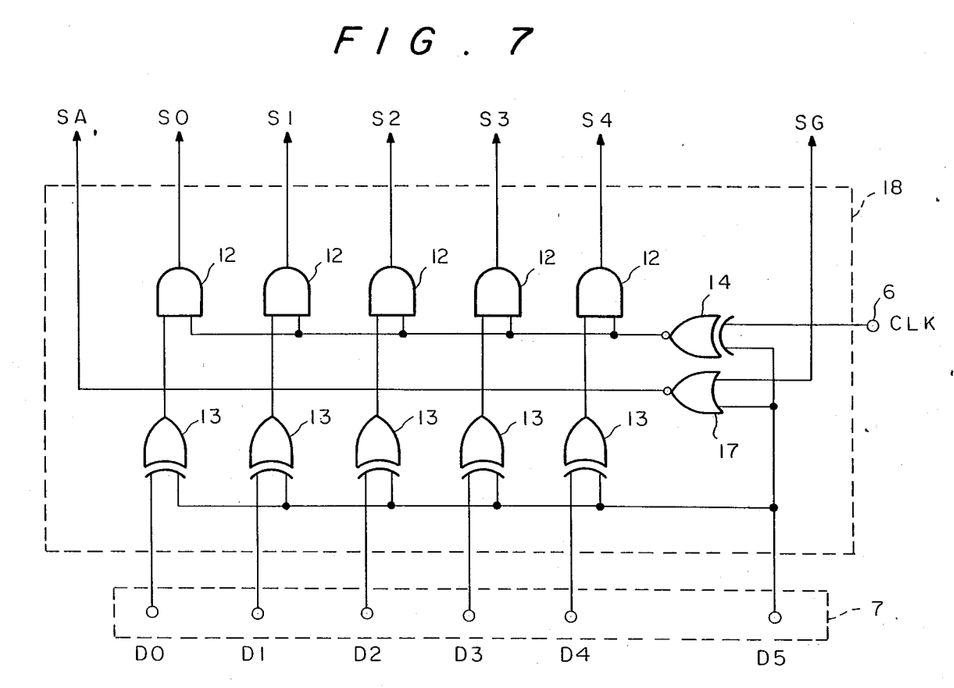

An alternative construction of the control circuit of the D/A converter in accordance with the present invention is shown in FIG. 7 and generally designated by the reference numeral 18. As shown, the control circuit 18 includes an NOR gate 17 in place of the AND gate 16 of the control circuit 15 of FIG. 4b. In this alternative configuration, when the input digital signal is positive, i.e., the sixth digit D5 is a ZERO and the clock pulse CLK is a ZERO, the control signal SA associated with the additional capacitor 10 is in a ONE. Hence, the additional capacitor 10 is constantly charged when the digital input is positive. It will be apparent that such a configuration implements the other of the previously stated two correction methods, i.e., adding 1 to the LSB of the input signal when the digital signal is positive.

In summary, it will be seen that the present invention provides a charge redistribution type D/A converter capable of directly handing digital signal which is represented by a 2's complement.

Various modifications will become possible for those skilled in the art after receiving the teachings of the present disclosure without departing from the scope thereof.

What is claimed is:

1. A digital-to-analog (D/A) converter for converting an n-bit digital signal represented by 2's complement to an analog signal, comprising:
    capacitor array means comprising (n−1) capacitors each being weighted by a 2's power and commonly connected at one electrode to a common output terminal;
    control means for producing first, second and third control signals from an operation clock and the digital signal;
    switch array means comprising (n−1) switches connected one-to-one to the other electrode of said ($n-1$) capacitors for applying either one of a first or a second reference voltage to said ($n-1$) capacitors in response to the second control signal;

additional capacitor means connected at one electrode to said output terminal;

first switch means connected to the other electrode of said additional capacitor means for feeding either one of the first and second reference voltages to said additional capacitor means in response to the first control signal; and second switch means connected to said output terminal for feeding the first reference voltage in response to the third control signal.

2. A D/A converter as claimed in claim 1, wherein said additional capacitor means has a capacitance equal to a capacitance of one of said ($n-1$) capacitors having the smallest capacitance.

3. A D/A converter as claimed in claim 1, wherein said control means comprises:

first control signal generating means for generating the first control signal for said first switch means from an operation clock pulse and the most significant bit (MSB) of the digital signal;

first gate means for receiving ($n-1$) bits of the digital signal other than the MSB and outputting the ($n-1$) bits by or without inverting the respective bits, depending upon a value of the MSB;

timing signal generating means for generating a timing signal from the operation clock pulse and the MSB;

second gate means for delivering output signals of said first gate means as the second control signal for said first switch means in response to the timing signal; and second control signal generating means for generating the third control signal for said second switch means from the operation clock pulse.

4. A D/A converter as claimed in claim 3, wherein said timing signal generating means comprises an Exclusive-NOR gate means.

5. A D/A converter as claimed in claim 4, wherein said first gate means comprises ($n-1$) Exclusive-OR gate means each receiving the MSB at one input terminal and respective one of the bits other than the MSB at the other input terminal.

6. A D/A converter as claimed in claim 5, wherein said second gate means comprises ($n-1$) AND gate means each receiving the timing signal at one input terminal and respective one of output signals of said ($n-1$) Exclusive-OR gate means.

7. A D/A converter as claimed in claim 6, wherein said second control signal generating means comprises means for directly outputting the operation clock as the third control signal.

8. A D/A converter as claimed in claim 6, wherein said first control signal generating means comprises AND gate means.

9. A D/A converter as claimed in claim 6, wherein said first control signal generating means comprises NOR gate means.

10. A digital-to-analog (D/A) converter for converting an n-bit digital signal represented by 2's complement to an analog signal, comprising:

capacitor array means comprising ($n-1$) capacitors each being weighted by a 2's power and commonly connected at one electrode to a common output terminal;

switch array means comprising ($n-1$) switches connected one-to-one to the other electrode of said ($n-1$) capacitors for applying either one of a first or a second reference voltage to said ($n-1$) capacitors in response to a second control signal;

additional capacitor means connected at one electrode to said output terminal;

first switch means connected to the other electrode of said additional capacitor means for feeding either one of the first or second reference voltage to said additional capacitor means in response to a first control signal;

second switch means connected to said output terminal for feeding the first reference voltage in response to a third control signal; and control means for controlling said switch array means, first switch means and second switch means, said control means comprising:

first gate means responsive to the n-bit digital signal for converting the least significant through ($n-1$)th digits of the n-bit digital signal to a second ($n-1$)-bit digital signal represented by 1's complement, second gate means responsive to said second ($n-1$)-bit digital signal and the most significant digit of said n-bit digital signal for controlling delivery of said second ($n-1$)-bit digital signal to produce said second control signal, third gate means responsive to the most significant digit of said n-bit digital signal for producing the first control signal, and means responsive to an operation clock for generating said third control signal.

* * * * *